(12) United States Patent
Aichinger et al.

(10) Patent No.: US 11,940,489 B2
(45) Date of Patent: Mar. 26, 2024

(54) SEMICONDUCTOR DEVICE HAVING AN OPTICAL DEVICE DEGRADATION SENSOR

(71) Applicant: Infineon Technologies AG, Neubiberg (DE)

(72) Inventors: Thomas Aichinger, Faak am See (AT); Maximilian Wolfgang Feil, Kirchseeon (DE); Andre Kabakow, Großhelfendorf (DE); Hans Reisinger, Gruenwald (DE)

(73) Assignee: Infineon Technologies AG, Neubiberg (DE)

( * ) Notice: Subject to any disclaimer, the term of this patent is extended or adjusted under 35 U.S.C. 154(b) by 112 days.

(21) Appl. No.: 17/502,335

(22) Filed: Oct. 15, 2021

(65) Prior Publication Data
US 2023/0121426 A1   Apr. 20, 2023

(51) Int. Cl.
| | | |
|---|---|---|
| *G01R 31/311* | (2006.01) | |
| *G01R 31/00* | (2006.01) | |
| *H01L 25/16* | (2023.01) | |
| *H01L 25/18* | (2023.01) | |
| *H01L 27/144* | (2006.01) | |
| *H03K 17/687* | (2006.01) | |

(52) U.S. Cl.
CPC ............ *G01R 31/311* (2013.01); *G01R 31/00* (2013.01); *H01L 25/167* (2013.01); *H01L 25/18* (2013.01); *H01L 27/1443* (2013.01); *H03K 17/687* (2013.01)

(58) Field of Classification Search
None
See application file for complete search history.

(56) References Cited

U.S. PATENT DOCUMENTS

| | | | | | |
|---|---|---|---|---|---|
| 5,153,503 | A | * | 10/1992 | Yahata | ............... G01N 21/6489 324/73.1 |
| 5,430,386 | A | * | 7/1995 | Morin | ................ G01R 31/2648 324/762.05 |
| 6,049,220 | A | * | 4/2000 | Borden | .............. G01N 21/1717 257/E21.53 |

(Continued)

OTHER PUBLICATIONS

Puschkarsky, K., et al., "Review on SiC MOSFETs High-Voltage Device Reliability Focusing on Threshold Voltage Instability", IEEE Transactions on Electron Devices, vol. 66, No. 11, Nov. 2019, pp. 4604-4616.

(Continued)

*Primary Examiner* — Kenneth B Wells
(74) *Attorney, Agent, or Firm* — Murphy, Bilak & Homiller, PLLC

(57) ABSTRACT

A semiconductor device includes: a semiconductor body; an electrical device formed in an active region of the semiconductor body, the active region including an interface between the semiconductor body and an insulating material; and a sensor having a bandwidth tuned to at least part of an energy spectrum of light emitted by carrier recombination at the interface when the electrical device is driven between accumulation and inversion, wherein an intensity of the emitted light is proportional to a density of charge trapping states at the interface, wherein the sensor is configured to output a signal that is proportional to the intensity of the sensed light. Corresponding methods of monitoring and characterizing the semiconductor device and a test apparatus are also described.

21 Claims, 14 Drawing Sheets

(56) References Cited

U.S. PATENT DOCUMENTS

| | | | | |
|---|---|---|---|---|
| 6,051,828 | A * | 4/2000 | Patterson | G01R 31/311 250/214 R |
| 6,075,234 | A * | 6/2000 | Patterson | G01R 31/311 250/559.07 |
| 6,836,139 | B2 * | 12/2004 | Howland | G01R 31/2648 324/754.03 |
| 6,856,159 | B1 * | 2/2005 | Tolk | G01R 31/311 324/762.01 |
| 7,057,409 | B2 * | 6/2006 | Wills | G01R 31/31718 324/762.02 |
| 7,265,571 | B2 * | 9/2007 | Srocka | G01R 31/2656 324/762.01 |
| 7,397,263 | B2 * | 7/2008 | Condon | G01R 31/31728 324/501 |
| 2003/0183769 | A1 * | 10/2003 | Ito | G01T 1/178 250/364 |
| 2010/0060895 | A1 * | 3/2010 | Oshima | G01N 21/9501 356/369 |
| 2011/0242537 | A1 * | 10/2011 | Shigeta | G01N 21/8903 356/430 |
| 2017/0322147 | A1 * | 11/2017 | Sugihara | G01J 3/42 |
| 2018/0113221 | A1 * | 4/2018 | Ishikawa | C09K 11/02 |
| 2018/0233528 | A1 | 8/2018 | Na et al. | |
| 2021/0223398 | A1 * | 7/2021 | Koudar | G01S 7/4863 |

OTHER PUBLICATIONS

Reisinger, H., "Analysis of NBTI Degradation- and Recovery-Behavior Based on Ultra Fast VT-Measurements", IEEE 44th Annual International Reliability Physics Symposium, San Jose, 2006, pp. 448-453.

Chen, Cen, et al., "In-situ Prognostic Method of Power MOSFET Based on Miller Effect", Prognostics and System Health Management Conference (PHM-Harbin),, 2017.

Jiang, Huaping, et al., "Dynamic Gate Stress Induced Threshold Voltage Drift of Silicon Carbide MOSFET", IEEE Electron Device Lett., 2020.

Macfarlane, P.J., et al., "Characterization of Light Emission from 4H and 6H SiC MOSFETs", Mat. Res. Soc. Symp. Proc. vol. 640, Materials Research Society, 2001, pp. H4.9.1-H4.9.6.

Stahlbush, R.E., et al., "Light emission from 4H SiC MOSFETs with and without NO passivation", Microelectronic Engineering 59, 2001, pp. 393-398.

Stahlbush, R.E., et al., "Light Emission from Interface Traps and Bulk Defects in SiC MOSFETs", Journal of Electronic Materials, vol. 30, No. 3, 2001, pp. 188-195.

* cited by examiner

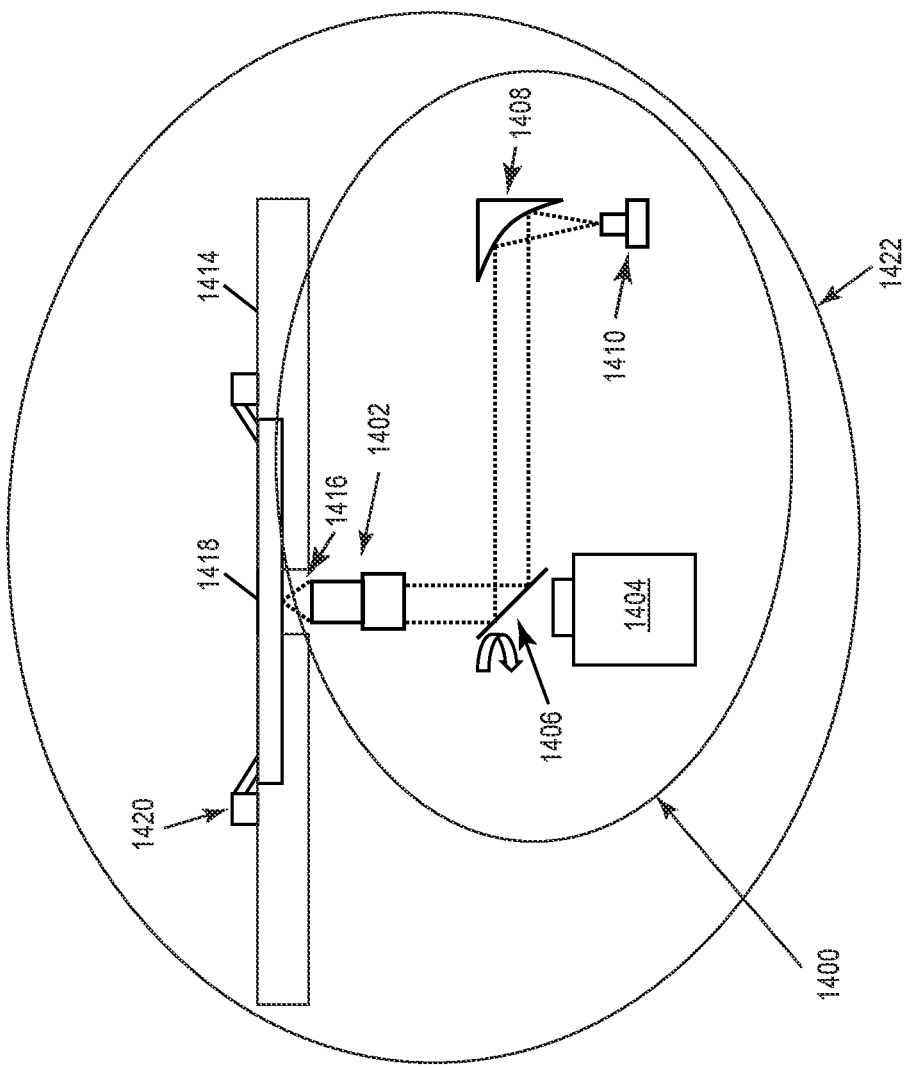
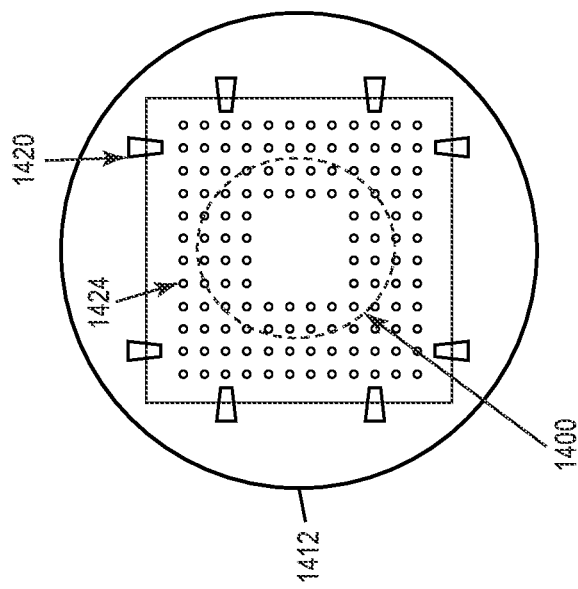
FIG. 14

SEMICONDUCTOR DEVICE HAVING AN OPTICAL DEVICE DEGRADATION SENSOR

BACKGROUND

MOSFET (metal-oxide-semiconductor field-effect transistor) devices are prone to bias temperature instability (BTI) which originates from charge trapping at the gate oxide in the vicinity of the channel. The trapped charges electrostatically change the threshold voltage of the device over operation time. So far, the threshold voltage shift is typically measured by removing a MOSFET device from the application circuitry to place it in a separate measurement setup. Such a process is difficult to realize in that it would require interruption of the application and disassembly of the circuitry. Given the difficult nature of such a measurement process, the end-of-life of a MOSFET could only be realized by the total failure of the application circuitry.

Another approach involves measuring the threshold voltage of a MOSFET device during application and which is based on the measurement of the miller plateau voltage. However, this method requires the measurement of the gate waveform signal, which in turn requires complex electronics and/or computations. Furthermore, the calibration of this method is difficult, as it requires a long-lasting reference measurement for each application condition.

In many applications, such as solar or automotive inverters, the MOSFET devices are operated with a high frequency gate signal (e.g., up to 100 kHz). In case the voltage levels of the AC gate signal are of different polarity, a degradation mechanism is triggered that leads to an increase of the threshold voltage which also is difficult to measure.

Thus, there is a need for an improved device degradation measuring technique.

SUMMARY

According to an embodiment of a semiconductor device, the semiconductor device comprises: a semiconductor body; an electrical device formed in an active region of the semiconductor body, the active region including an interface between the semiconductor body and an insulating material; and a sensor having a bandwidth tuned to at least part of an energy spectrum of light emitted by carrier recombination at the interface when the electrical device is driven between accumulation and inversion, wherein an intensity of the emitted light is proportional to a density of charge trapping states at the interface, wherein the sensor is configured to output a signal that is proportional to the intensity of the sensed light.

According to an embodiment of a method of monitoring a semiconductor device that includes an electrical device formed in an active region of a semiconductor body, the active region including an interface between the semiconductor body and an insulating material, the method comprises: driving the electrical device between accumulation and inversion; sensing at least part of an energy spectrum of light emitted by carrier recombination at the interface when the electrical device is driven between accumulation and inversion, wherein an intensity of the emitted light is proportional to a density of charge trapping states at the interface; and generating a signal that is proportional to the intensity of the sensed light.

According to an embodiment of a method of characterizing a semiconductor device that includes an electrical device formed in an active region of a semiconductor body, the active region including an interface between the semiconductor body and an insulating material, the method comprises: driving each electrical device between accumulation and inversion; guiding, to a spectrometer device, light emitted by carrier recombination at the interface of the electrical device when the electrical device is driven between accumulation and inversion; and measuring, by the spectrometer device, an energy spectrum of the light emitted by carrier recombination at the interface of the electrical device when the electrical device is driven between accumulation and inversion, wherein an intensity of the emitted light is proportional to a density of charge trapping states at the interface.

According to an embodiment of a test apparatus, the test apparatus comprises: a mechanical interface configured to receive an individual semiconductor device or a semiconductor wafer that includes a plurality of semiconductor devices, each semiconductor device including an electrical device formed in an active region of a semiconductor body, the active region including an interface between the semiconductor body and an insulating material; an electrical interface configured to drive each electrical device between accumulation and inversion; a spectrometer device configured to measure an energy spectrum of light emitted by carrier recombination at the interface of each electrical device when the electrical device is driven between accumulation and inversion, wherein an intensity of the emitted light is proportional to a density of charge trapping states at the interface; and one or more optical components configured to guide the emitted light to the spectrometer device.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 14 illustrates a schematic view of an embodiment of a test apparatus for monitoring and characterizing a semiconductor wafer.

DETAILED DESCRIPTION

Described herein are an optical device degradation sensor for semiconductor devices, related methods of monitoring and characterizing semiconductor devices using the optical device degradation sensor, and a related test apparatus. The optical device degradation sensor measures photonic emission intensity from a semiconductor device such as a SiC MOSFET. The magnitude of the threshold voltage drift for the semiconductor device may be determined based on the emission intensity detected by the optical device degradation sensor. The device may be characterized by analyzing the spectrum of the emitted light.

Described next, with reference to the figures, are exemplary embodiments of the optical device degradation sensor, related methods of monitoring and characterizing semiconductor devices using the optical device degradation sensor, and a related test apparatus.

Figure 1:
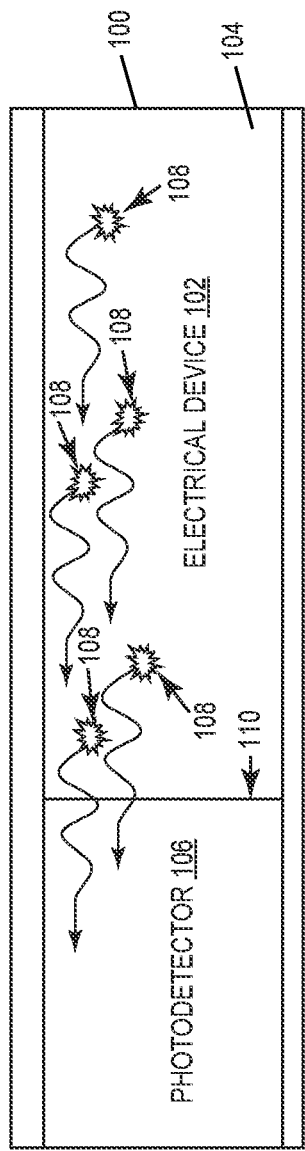
FIG. 1 illustrates a cross-sectional view of an embodiment of a semiconductor device that includes a semiconductor body, an electrical device formed in an active region of the semiconductor body, and an optical device degradation sensor configured to sense light or other electromagnetic radiation emitted by the electrical device.

FIG. 1 illustrates an embodiment of a semiconductor device that includes a semiconductor body 100 and an electrical device 102 formed in an active region 104 of the semiconductor body 100. The active region 104 includes an interface between the semiconductor body 100 and an insulating material. The interface and insulating material are not shown in FIG. 1 for ease of illustration.

The electrical device 102 formed in the active region 104 of the semiconductor body 100 may be an active or passive device. For example, the electrical device 102 may be a Si, GaN or SiC MOSFET where the interface between the semiconductor body 100 and the insulating material is a channel interface. In another example, the electrical device 102 may be a capacitor where the interface is a semiconductor-oxide interface. Still other types of electrical devices 102 may be formed in the active region 104 of the semiconductor body 100.

The semiconductor device also includes an optical device degradation sensor 106. The sensor 106 is a photodetector (photosensor) configured to sense light or other electromagnetic radiation emitted by the electrical device 102. For example, the sensor 106 may be a photodiode, an avalanche photodiode, a silicon photo multiplier, etc.

In each case, the sensor 106 has a bandwidth tuned to at least part of an energy spectrum of light emitted by carrier recombination at the interface between the semiconductor body 100 and the insulating material when the electrical device 102 is driven between accumulation and inversion. That is, the sensor 106 has a certain output intensity based on wavelength. The bandwidth at which the sensor 106 is sensitive covers a spectrum of interest.

The energy band diagram between the semiconductor body 100 and the insulating material includes a barrier for one carrier type (e.g., holes) and an accumulation well for the opposite carrier type (e.g., electrons). During accumulation, no conduction channel is formed. During inversion, the conductivity type of the semiconductor body 100 inverts at the interface with the insulating material (e.g., from p-type to n-type) to form a conduction channel.

The intensity of the light emitted by carrier recombination at the interface between the semiconductor body 100 and the insulating material when the electrical device 102 is driven between accumulation and inversion is proportional to a density of charge trapping states 108 that take part in the carrier recombination at the interface of interest. The intensity of light generally means I=E*N/(t*A) where E is energy, N is the number of photons per measurement time (t) and area (A). The sensed light intensity is approximated by the sensor 106 being tuned to a specific wavelength or wavelength range.

The term 'charge trapping state' as used herein refers to any type of charge trapping state at the interface of interest which leads to emission of a photon. The sensor 106 outputs a signal that is proportional to the intensity of the sensed light. The term 'proportional' as used herein means corresponding in size, degree, or intensity. Accordingly, the sensor output may be linearly or non-linearly proportional to the intensity of the sensed light.

Figure 2C:
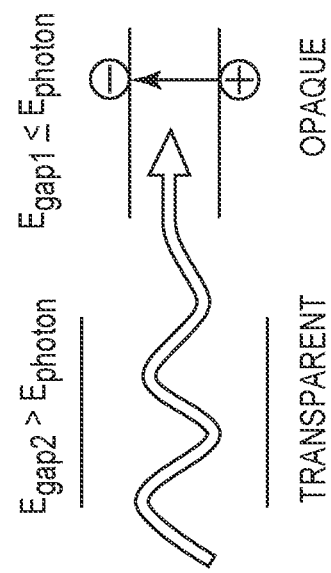
FIG. 2C illustrates which materials are transparent with respect to a light emission and which materials are opaque with respect to the light emission.
Figure 2A:
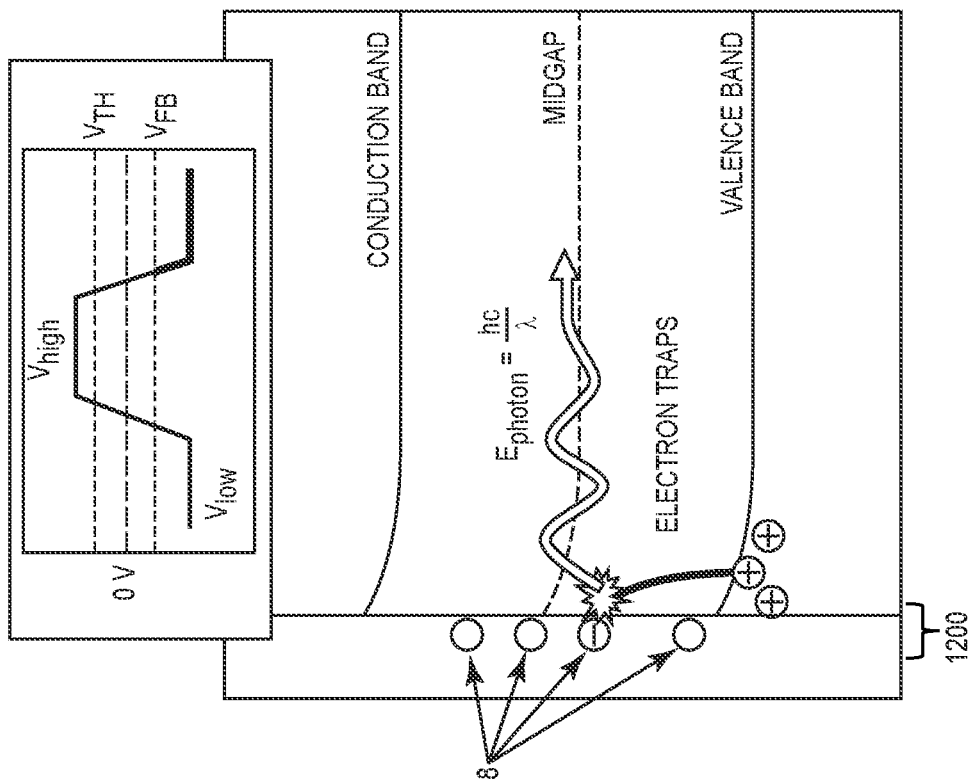
FIGS. 2A and 2B illustrate the carrier recombination that occurs at an interface of interest within a semiconductor device under test, when the electrical device included in the semiconductor device is driven between accumulation and inversion.
Figure 2B:
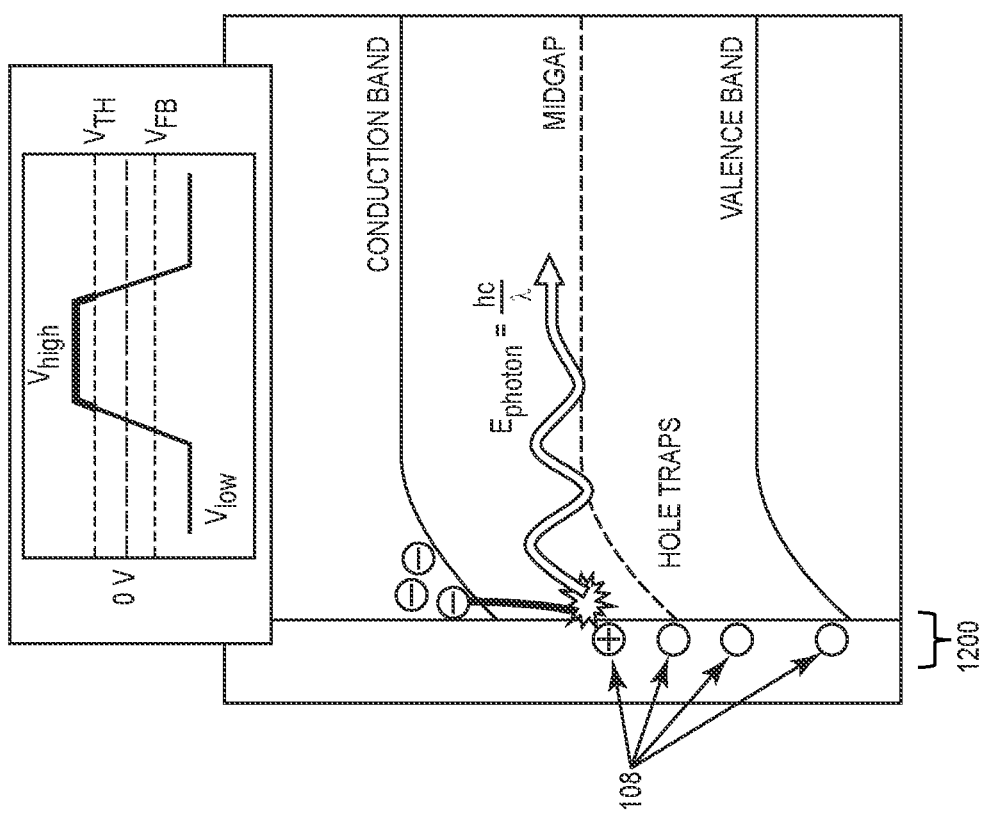

For example, when a SiC MOSFET is driven between accumulation and inversion, the defect-assisted recombination of electrons ('−') and holes ('+') at the interface between SiC and the gate dielectric insulating material (e.g., $SiO_2$) leads to the emission of photons, e.g., as shown in FIGS. 2A and 2B. The resulting light emission for such defect-assisted recombination is in the visible and NIR (near infrared) range of 400 to 900 nm for SiC. FIG. 2C shows which materials are transparent with respect to the light emission and which materials are opaque with respect to the light emission. The sensor 106 may be used with still other types of semiconductor materials, such as but not limited to Si or GaN.

As shown in FIGS. 2A and 2B, the carrier recombination that occurs at the interface of interest (e.g., channel interface) when the electrical device 102 is driven between accumulation and inversion. FIG. 2A shows inversion, where the driving signal is at a high voltage level Vhigh which is above both the flat band voltage $V_{FB}$ and the threshold voltage $V_{TH}$ of the electrical device 102. During inversion, electrons ('−') in the conduction band recombine with corresponding holes ('+') associated with charge trapping states 108 at the interface of interest. FIG. 2B shows accumulation, where the driving signal is at a low voltage level Vlow which is below both the flat band voltage $V_{FB}$ and threshold voltage $V_{TH}$ of the electrical device 102. During accumulation, holes ('+') in the valence band recombine with corresponding electrons ('−') associated with charge trapping states 108 at the interface of interest.

In general, the intensity and spectrum of the emitted photons reflect the properties of the interface defects. Device degradation may influence the intensity of photon emission at a certain wavelength. Accordingly, the emission intensity measured by the sensor 106 reflects the intensity over a certain wavelength range and may be used to determine changes of the interface properties and thus of the device reliability.

The emission intensity decreases with increasing stress time of an applied bipolar AC gate voltage, which may be related both to the change of charge carrier density in the channel or to a change of the defect-assisted recombination itself. Conversely for a DC stress signal, the emission intensity increases. In either case (AC or DC), emission intensity correlates with threshold voltage shift, making it suitable for in situ threshold voltage monitoring by the sensor 106 during device operation.

The sensor 106 may be monolithically integrated with the electrical device 102 in the same semiconductor body 100 or may be provided on a separate die (chip). For example, the sensor 106 may be placed where there is a direct optical path through the semiconductor body 100 to the interface of interest. The direct optical path in the semiconductor body 100 optically couples the sensor 106 to the interface of interest for at least part of the energy spectrum of the light emitted by carrier recombination at the interface when the electrical device 102 is driven between accumulation and inversion.

For example, SiC has a band gap of approximately 3.26 eV. Most light below this energy would not be absorbed. An $SiO_2$ gate oxide also would not absorb the light emission as $SiO_2$ has an even larger band gap about 9 eV. Accordingly, the sensor 106 may be placed at the edge 110 of the semiconductor body 100 where the material in the optical pathway between the electrical device 102 and sensor 106 is transparent for the light emitted by the electrical device 102.

In one embodiment, the emission energy of the light may be in a range of 1.4 to 3.0 eV and the edge 110 of the semiconductor body 100 may include only SiC and/or $SiO_2$ since the bandgap of SiC (3.26 eV) and $SiO_2$ (8.9 eV) are above the energy of the emitted light. In this case, the emitted light will pass relatively unobstructed to the sensor 106 as shown in FIG. 2C, where the sensor 106 has a bandwidth ($E_{gap1}$) tuned to the bandgap ($E_{gap2}$) of the semiconductor body 100. For example, the bandwidth of the sensor 106 may be in a range of 1.3 to 3 eV for a photon 200 having a light emission energy range ($E_{photon}$) of 1.4 to 3.0 eV. In this case, the sensor 106 efficiently converts impinging photons 200 into an electrical current. The magnitude of the electrical current output by the sensor 106 corresponds to the intensity of the emitted light detected by the sensor 106. The bandwidth of the sensor 106 may be tailored to a subrange of the energy spectrum of the light emitted by carrier recombination at the interface when the electrical device 102 is driven between accumulation and inversion, the subrange of the energy spectrum being most closely correlated to the density of charge trapping states at the interface.

Other placement configurations for the sensor 106 are contemplated. For example, the semiconductor body 100 that includes the electrical device 102 may provide waveguiding and the sensor 106 may be monolithically integrated with the electrical device 102 in the same semiconductor body 100. This may involve placing the sensor 106 in close proximity to the semiconductor-insulator interface where the light emission occurs and without an intervening light absorbing layer such as metallization in between. In the case of a SiC MOSFET, and to capture most of the emitted light, the sensor 106 may be formed in a trench where the semiconductor-insulator channel interface is on both sides, e.g., 50 to 100 nm away. In another example, the sensor 106 may be placed in an edge of the semiconductor body 100 where the sensor 106 is still close enough to the emitted light. In still another option, the sensor 106 may be placed outside the chip that includes the electrical device, with an opening in the chip metallization (e.g., drain metal for bottom side observation or source metal for top side observation) so as to not obstruct the emitted light from reaching the sensor 106.

Independent of the chip design (e.g., trench or planar), photoemissions reach the sensor 106 without being absorbed. The higher refractive index of the semiconductor body 100 should further enhance the amount of detected signal by wave guiding effects, where the spectrum of the emission is typically between 400 nm and 900 nm. Various sensor placement embodiments are described next in more detail.

Figure 3:
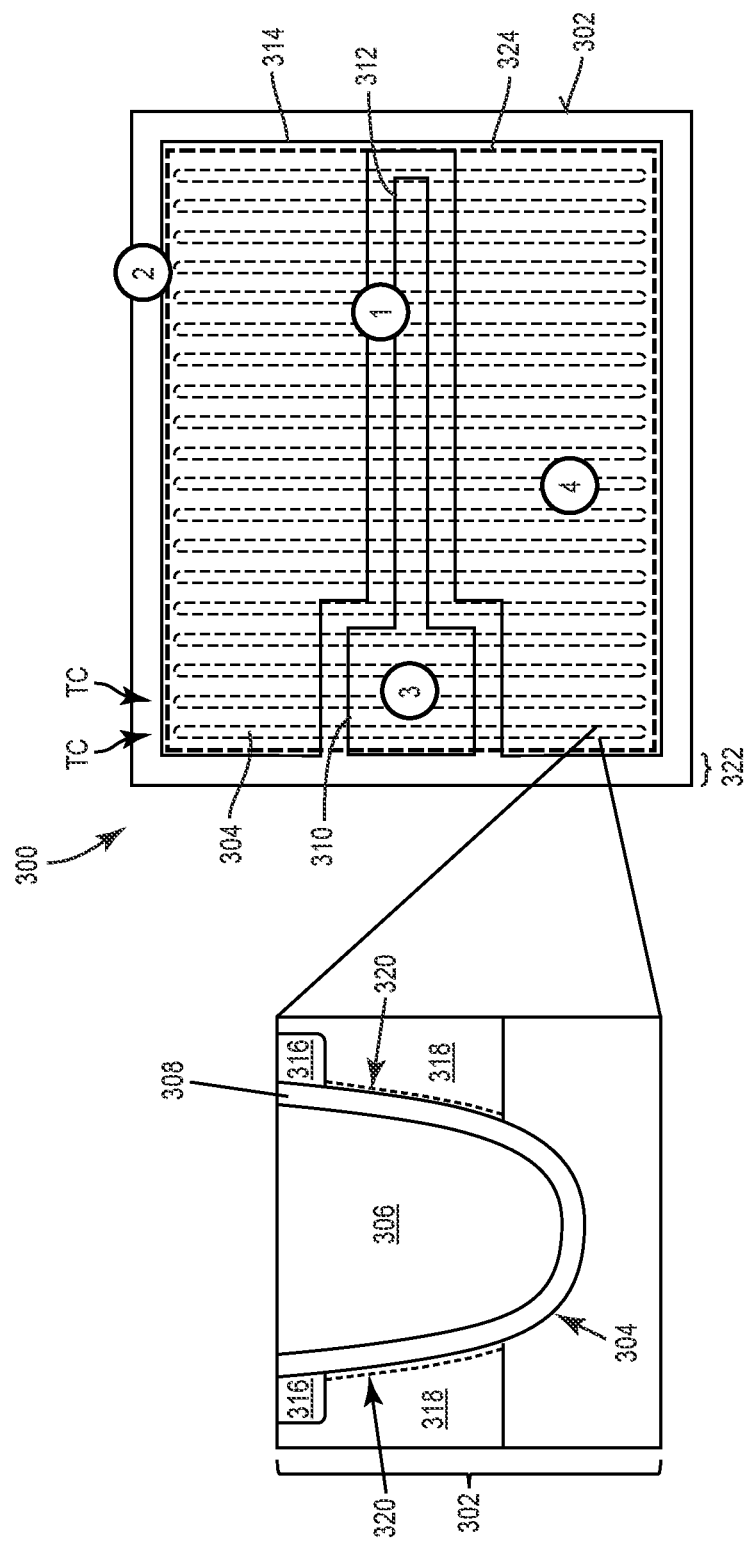
FIG. 3 illustrates a top plan view of an embodiment of a SiC device that includes the optical device degradation sensor.

FIG. 3 illustrates a top plan view of a SiC device 300. The SiC device 300 includes a SiC substrate 302 and a plurality of transistor cells 'TC' formed in the SiC substrate 302. The transistor cells TC are electrically connected in parallel to form a SiC power transistor device. The transistor cells TC include trenches 304 formed in the SiC substrate 302. Each trench 304 includes a gate electrode 306 separated from the surrounding SiC substrate 302 by a gate dielectric 308 such as $SiO_2$. An enlarged cross-sectional view of one trench 304 is shown in FIG. 3.

A gate pad 310 above the SiC substrate 302 provides a point of contact for the gate potential, and a gate runner 312 extending from the gate pad 310 provides electrical contact through vias (not visible) to the gate electrodes 306 disposed in the trenches 304. A source pad 314 above the SiC substrate 302 similarly provides a point of contact for the source potential which is provided by vias (not visible) to the source regions 316 and body regions 318 of the transistor cells TC. The drain contact is provided at the backside of the SiC substrate 302 which is out of view in FIG. 3.

According to the embodiment illustrated in FIG. 3, carrier recombination occurs at the channel interface 320 between the SiC substrate 302 and the gate dielectric 308 of the transistor cells TC when the power transistor device is driven between accumulation and inversion. A change in magnitude of the signal output by the sensor 106 is proportional to a threshold voltage drift of the power transistor device. Also, the sensor 106 is monolithically integrated in the same SiC substrate 302 as the power transistor device formed by the parallel-connected transistor cells TC.

Placement options for the sensor 106 are labelled '1' through '4' in FIG. 3. For location '1', the sensor 106 is disposed under the gate pad 310. For location '2', the sensor 106 is formed in an edge termination region 322 of the SiC substrate 302 that laterally surrounds the active region 324 that includes the transistor cells TC. The edge termination region 322 is devoid of any fully functional cells of the power transistor device. That is, the edge termination region 322 does not contain active transistor cells. For location '3', the sensor 106 is disposed adjacent the gate runner 312 extending from the gate pad 310. For location '4', the sensor 106 is formed in the active region 324 of the SiC substrate 302.

Figure 4B:
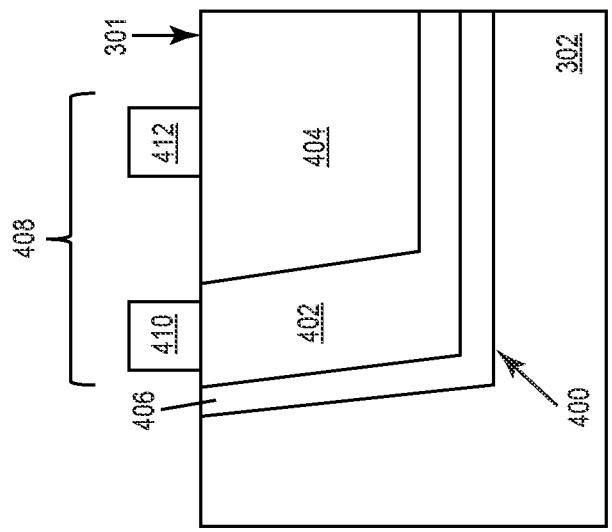
FIGS. 4A and 4B illustrate respective cross-sectional views of an embodiment of the optical device degradation sensor.
Figure 4A:
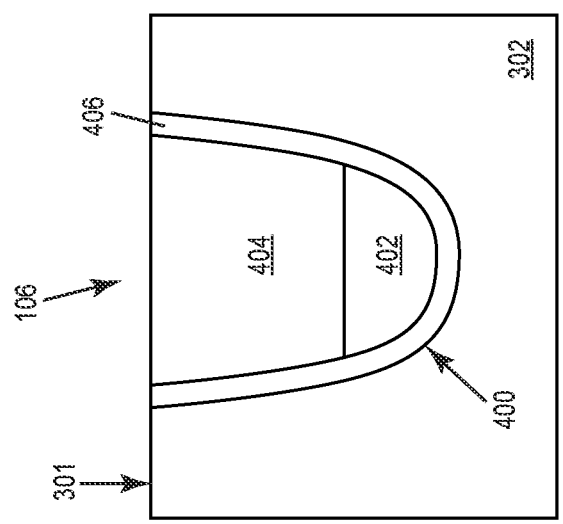

FIG. 4A illustrates a first cross-sectional view of an embodiment of the sensor 106 and FIG. 4B illustrates a second cross-sectional view of an embodiment of the sensor 106. The sensor 106 is disposed in a trench 400 formed in the SiC substrate 302. The cross-section in FIG. 4A is taken across the width of the trench 400 whereas the cross-section in FIG. 4B is taken along the length of the trench 400, in an end region of the trench 400.

According to the embodiment illustrated in FIGS. 4A and 4B, the sensor 106 is a photodiode, an avalanche photodiode or a silicon photo multiplier comprising a semiconductor material of a first conductivity type (e.g., p-type) 402 disposed in a lower part of the trench 400 and a semiconductor material of a second conductivity type opposite the first conductivity type (e.g., n-type) 404 disposed on the semiconductor material of the first conductivity type 402 in an upper part of the trench 400 to form a photosensor. Photons entering the pn-junction formed between the semiconductor regions 402, 404 induce a photo-effect. That is, electron-hole pairs are created and separated which in turn creates a current, e.g., as shown in FIG. 2C. The semiconductor regions 402, 404 of opposite conductivity type that form the sensor 106 are separated from the surrounding SiC substrate 302 by a dielectric material 406 such as $SiO_2$.

A contact structure 408 may be provided at the end of the trench 400, as shown in FIG. 4B. The semiconductor material of the first conductivity type 402 disposed in the lower part of the trench 400 extends up to the front surface 301 of the SiC substrate 302 in the end region of the trench 400. A first contact 410 provides a point of electrical contact to the semiconductor material of the first conductivity type 402 and a second contact 412 provides a point of electrical contact to the semiconductor material of the second conductivity type 404, to access the electrical signal output by the sensor 106. The contact structure 408 instead may be provided at a different part of the trench 400, e.g., in a center part along the length of the trench 400.

Figure 5:
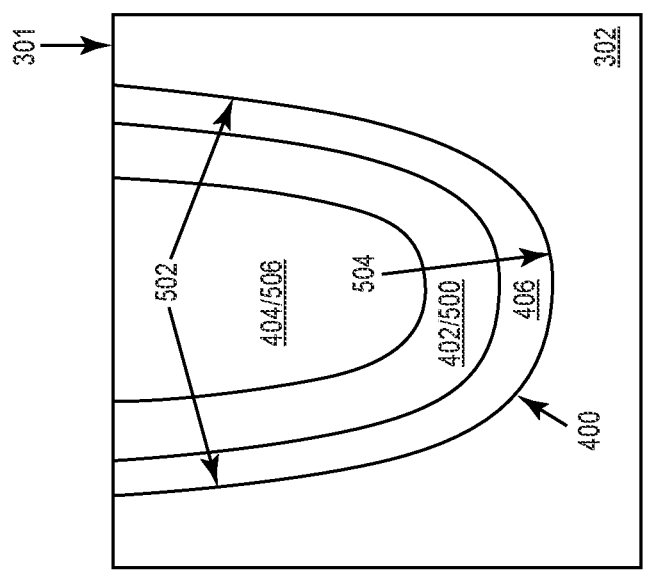
FIG. 5 illustrates a cross-sectional view of another embodiment of the optical device degradation sensor.

FIG. 5 illustrates a cross-sectional view of another embodiment of the sensor 106. The embodiment shown in FIG. 5 is similar to the embodiment shown in FIGS. 4A and 4B. Different, however, the semiconductor material of the first conductivity type 402 is formed as a first layer 500 that lines the sidewalls 502 and the bottom 504 of the trench 400 with the dielectric material 406 interposed therebetween. The first layer 500 extends up to the front surface 301 of the SiC substrate 302 along the entire length of the trench 400 instead of only in the end region of the trench 400. Accordingly, both semiconductor regions 402, 404 that form the sensor 106 are accessible for contacting along the entire length of the trench 400. The semiconductor material of the second conductivity type 404 is formed as a second layer 506 over the first layer 500.

Figure 6:
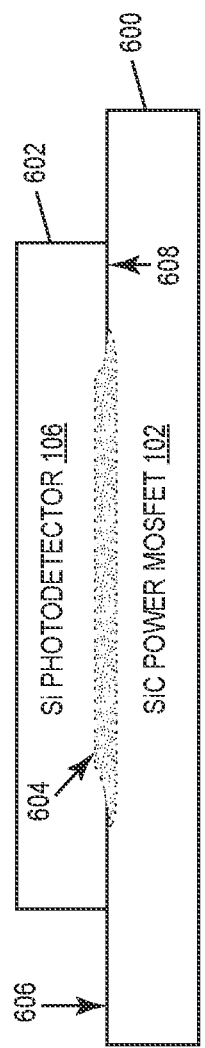
FIGS. 6 through 8 illustrate embodiments according to which the optical device degradation sensor is included in a different die (chip) than the electrical device.

FIGS. 3 through 5 illustrate embodiments according to which the sensor 106 is monolithically integrated with the monolithically integrated with the electrical device 102. FIGS. 6 through 8 illustrate embodiments according to which the sensor 106 is included in a different die (chip) than the electrical device 102.

In FIG. 6, the electrical device 102 optically monitored by the sensor 106 is included in a first semiconductor die 600 and the sensor 106 is included in a second semiconductor die 602. For example, the first semiconductor die 600 may be a SiC die, the electrical device 102 may be a vertical SiC power MOSFET, the second semiconductor die 602 may be a Si die, and the sensor 106 may be a Si photodetector.

The first semiconductor die 600 and the second semiconductor die 602 are arranged one on the other in a stacked arrangement. The light 604 emitted by carrier recombination at the interface of interest (e.g., channel interface) when the electrical device 102 is driven between accumulation and inversion propagates through a main surface 606 of the first semiconductor die 600 that faces the second semiconductor die 602 and into a main surface 608 of the second semiconductor die 602 that faces the first semiconductor die 600. In one embodiment, the main surface 606 of the first semiconductor die from which the light 604 is emitted is a source-side of the first semiconductor die 600. Accordingly, the source electrode and gate electrode (not shown) may be patterned to include one or more openings which allow the light 604 to pass unblocked to the second semiconductor die 602. The source electrode and gate electrodes are typically patterned, so only a modification of the patterning is needed to not block the emitted light 604.

Figure 7A:
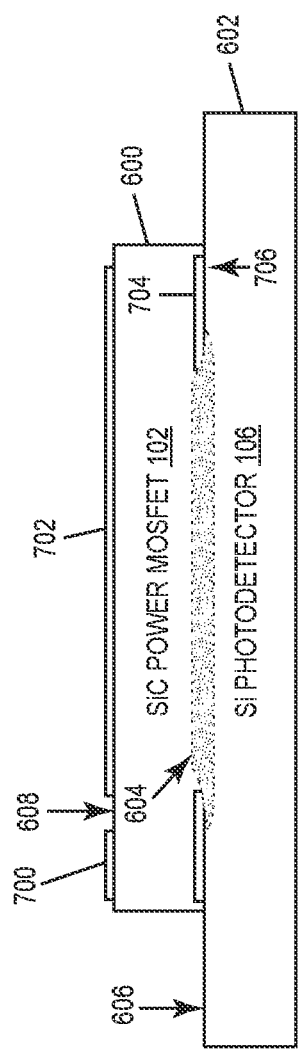
Figure 7B:
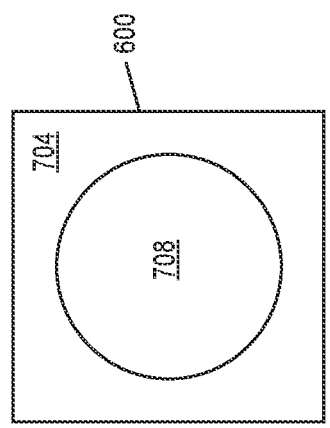
Figure 8:
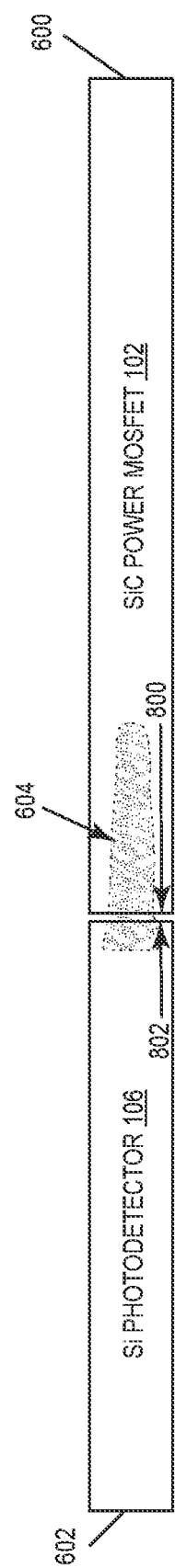

FIGS. 7A and 7B, like FIG. 6, illustrate an embodiment according to which the separate dies are arranged one on the other in a stacked arrangement. FIG. 7A shows a side perspective view of the stacked arrangement whereas FIG. 7B shows a bottom plan view of the stacked arrangement. The embodiment shown in FIGS. 7A-7B is similar to the embodiment shown in FIG. 6. Different, however, the first semiconductor die 600 with the vertical SiC power MOSFET 102 is stacked on the second semiconductor die 602 with the Si photodetector 106. According to this embodiment, the gate electrode 700 and the source electrode 702 for the vertical SiC power MOSFET are disposed at a first main surface 608 of the first semiconductor die 600, a drain electrode 704 for the vertical SiC power MOSFET 102 is disposed at a second main surface 706 of the first semiconductor die 600 opposite the first main surface 608, the second main surface 706 of the first semiconductor die 600 faces the second semiconductor die 602, and the drain electrode 704 has an opening 708 to permit the light 604 emitted by carrier recombination at the interface of interest when the vertical SiC power MOSFET 102 is driven between accumulation and inversion to propagate into the main surface 606 of the second semiconductor die 602 that faces the first semiconductor die 600. FIG. 7B shows an embodiment of the opening 708 in the drain electrode 704 for the vertical SiC power MOSFET 102.

In FIG. 8, the first semiconductor die 600 and the second semiconductor die 602 are arranged side-by-side, i.e., edge-to-edge. The light 604 emitted by carrier recombination at the interface of interest when the electrical device 102 is driven between accumulation and inversion propagates through an edge 800 of the first semiconductor die 600 that faces the second semiconductor die 602 and into an edge 802 of the second semiconductor die 602 that faces the first semiconductor die 600. The dies 600, 602 instead may be arranged at a 90 degree angle with respect to one another, so that the light 604 propagates from the edge 800 of the first die 600 into the front main sensing side 606 of the second die 602.

Figure 9:
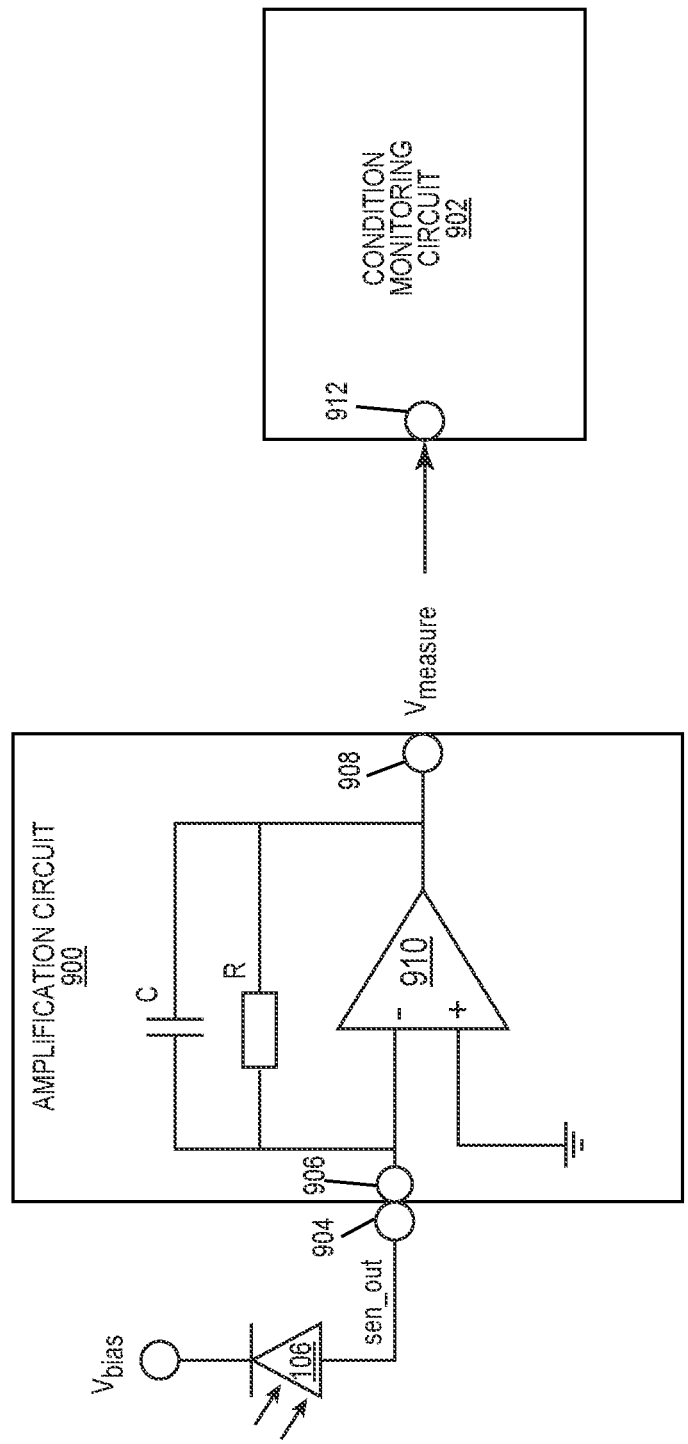
FIG. 9 illustrates a schematic view of an embodiment of an amplification circuit and a condition monitoring circuit that may be used in conjunction with the optical device degradation sensor.

FIG. 9 illustrates an embodiment of an amplification circuit 900 and a condition monitoring circuit 902 that may be used in conjunction with the sensor 106. The sensor 106 is illustrated schematically as a photodiode having a bias voltage Vbias in FIG. 9. However, as explained herein, the sensor 106 may be any type of photodetector (photosensor) configured to sense light or other electromagnetic radiation emitted by the electrical device 102. The amplification circuit 900 and/or the condition monitoring circuit 902 may or may not be monolithically integrated with either the electrical device 102 and/or the sensor 106.

If the sensor 106 is monolithically integrated with the electrical device 102, the signal 'sen_out' output by the sensor 106 must be strong enough to measure without amplification and a separate pin 904 is provided for reading out the sensor current. For example, the sensor may be monolithically integrated in the same semiconductor body as the electrical device 102 in a first semiconductor die and the amplification circuit may be disposed in a second semiconductor die. In this case, the first semiconductor die includes a pin 904 electrically coupled to the sensor 106, the pin 904 of the first semiconductor die is electrically coupled to a corresponding pin 906 of the second semiconductor die, and the pin 906 of the second semiconductor die is electrically coupled to an input ('−') of the amplification circuit 900. In general, the sensor 106 and amplification circuit 900 may be integrated in same die or disposed in separate dies. In either case, the package has at least one additional pin 908 for reading out the amplifier output 'Vmeasure'.

The amplification circuit 900 amplifies the signal sen_out output by the sensor 106. In one embodiment, the amplification circuit 900 includes a transimpedance amplifier implemented with an operational amplifier (opamp) 910 having a differential input '−, +' and a single-ended output Vmeasure. The transimpedance amplifier is shown implemented as an inverting transimpedance amplifier used with the photodiode 106 operating in the photoconductive mode. A positive voltage Vbias at the cathode of the photodiode applies a reverse bias. The reverse bias increases the width of the depletion region and lowers the junction capacitance, improving high-frequency performance. The operational amplifier 910 determines the transimpedance amplification. The operational amplifier 910 may be treated as an ideal opamp. Accordingly, the open-loop gain of the operational amplifier 910 may be considered infinite. The DC-amplification, that is conversion of input-current Iin into Vmeasure, is given by R where Vmeasure=Iin*R. Resistor R and capacitor C determine the integrative behavior of the amplification circuit 900.

The condition monitoring circuit 902 may be included in the same or different die as the amplification circuit 900. If the condition monitoring circuit 902 is included in a different die than the amplification circuit 900, the die that includes the condition monitoring circuit 902 has a pin 912 electrically coupled to the output Vmeasure of the amplification circuit 900.

The condition monitoring circuit 902 may be implemented as part of a smart gate driver, controller, etc. for monitoring the amplifier output Vmeasure. In one embodiment, the condition monitoring circuit 902 compares the output Vmeasure of the amplification circuit 900 to a threshold and may take some action if the threshold is crossed. For example, if the output Vmeasure of the amplification circuit 900 crosses the threshold, the condition monitoring circuit disables the electrical device 102 or adjusts a gate voltage for the electrical device 102 to maintain a gate overdrive at a constant value. As previously explained herein, light emission intensity decreases with increasing stress time of an applied AC signal and conversely increases for an applied DC signal. Accordingly, Vmeasure may 'cross' the threshold by either exceeding the threshold or falling below the threshold, depending on the type (AC or DC) of applied signal.

Figure 10:
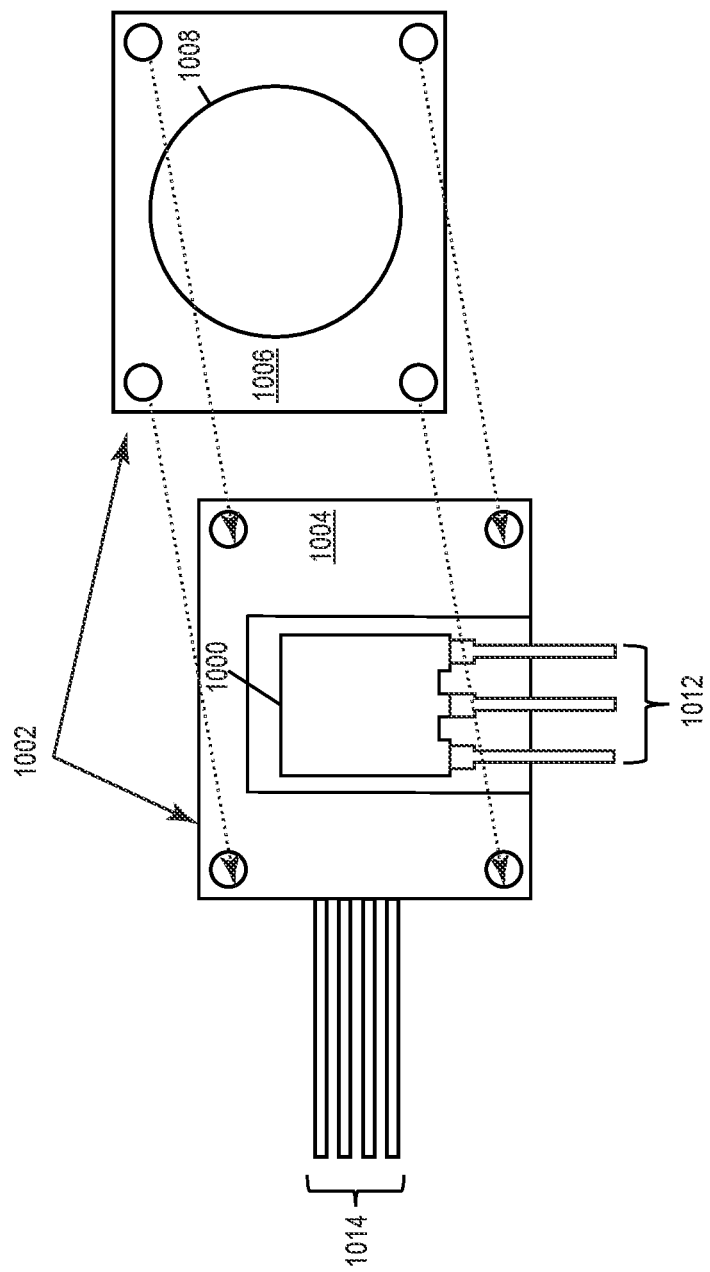
FIGS. 10 and 11 illustrate schematic views of an embodiment of a test apparatus for monitoring and characterizing a packaged semiconductor device that includes an electrical device formed in an active region of a semiconductor body.
Figure 11:
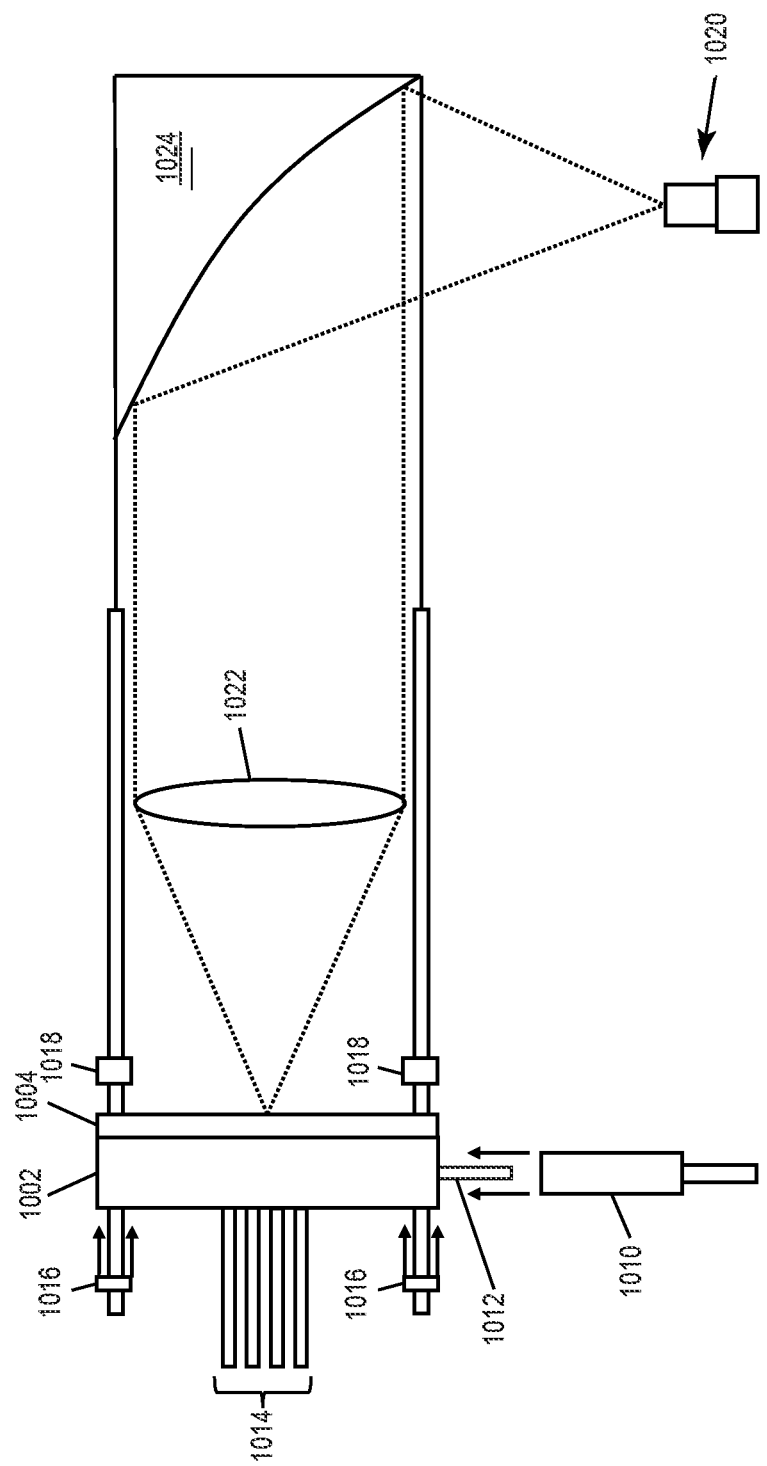

FIGS. 10 and 11 illustrate an embodiment of a test apparatus for monitoring and characterizing a package semiconductor device 1000 that includes an electrical device formed in an active region of a semiconductor body with the active region having an interface between the semiconductor body and an insulating material. FIG. 10 shows loading of the semiconductor device 1000 into the test apparatus, and FIG. 11 shows the test apparatus during use. The semiconductor device 1000 is a molded semiconductor device in FIGS. 10 and 11. However, other types of packaged semiconductor devices 1000 may be tested by the test apparatus illustrated in FIGS. 10 and 11.

The test apparatus includes a mechanical interface 1002 configured to receive the packaged semiconductor device 1000. For example, the mechanical interface 1002 may include a base 1004 and a cover 1006 placed over the base 1004 with the package semiconductor device 1000 sandwiched between. The cover 1006 has a window 1008 such as a quartz window that is transparent to the light emitted by the electrical device included in the packaged semiconductor device 1000 when driven between accumulation and inversion.

The test apparatus also includes an electrical interface 1010 such as a multi-pin contact plug and cables for electrically connecting to the packaged semiconductor device 1000 and which enables driving of the electrical device included in the packaged semiconductor device 1000 between accumulation and inversion. As shown in FIG. 10, the packaged semiconductor device 1000 may include 3 or more pins 1012, depending on the type of device 1000. In general, the electrical interface 1010 of the test apparatus is compatible with the pin-out or terminal configuration of the packaged semiconductor device 1000. The test apparatus may also include heating and temperature sensor cables 1014 that are connected to a controller such as a PID (proportional-integral-derivative) controller, for heating the packaged semiconductor device 1000 during testing and sensing the temperature inside the mechanical interface 1002. Fasteners 1016 such as screws and stoppers 1018 may be used to fix the packaged semiconductor device 1000 in place during testing.

During testing of a power semiconductor device 1000 such as a SiC MOSFET, the drain and source of the SiC MOSFET may be grounded and only the gate is switched via the electrical interface 1010 of the test apparatus. Under these conditions, no voltage is applied to the body diode of the SiC MOSFET so there is no current. Light emission happens whenever the SiC MOSFET is driven between accumulation and inversion, as previously explained herein. SiC MOSFETs are typically turned off with negative gate voltage below the flat band voltage $V_{FB}$. Hence, normal switching control of a SiC MOSFET brings about the light emission condition.

The test apparatus also includes a spectrometer device 1020 for measuring an energy spectrum of light emitted by carrier recombination at the interface of the electrical device included in the packaged semiconductor device 1000 when the electrical device is driven between accumulation and inversion. One or more components such as a lens 1022 like an achromatic objective lens and a reflective collimator 1024 guide the emitted light to the spectrometer device 1020.

As shown in FIGS. 2A and 2B, the carrier recombination that occurs at the interface of interest (e.g., channel interface) within the packaged semiconductor device 1000 when the electrical device included in the semiconductor device 1000 is driven between accumulation and inversion. FIG. 2A shows inversion, where the driving signal is at a high voltage level Vhigh which is above both the flat band voltage $V_{FB}$ and the threshold voltage $V_{TH}$ of the electrical device included in the semiconductor device 1000. During inversion, electrons ('−') in the conduction band recombine with corresponding holes ('+') associated with charge trapping states 108 at the interface 1200 of interest. FIG. 2B shows accumulation, where the driving signal is at a low voltage level Vlow which is below both the flat band voltage $V_{FB}$ and threshold voltage $V_{TH}$ of the electrical device included in the semiconductor device 1000. During accumulation, holes ('+') in the valence band recombine with corresponding electrons ('−') associated with charge trapping states 108 at the interface 1200 of interest.

Figure 12:
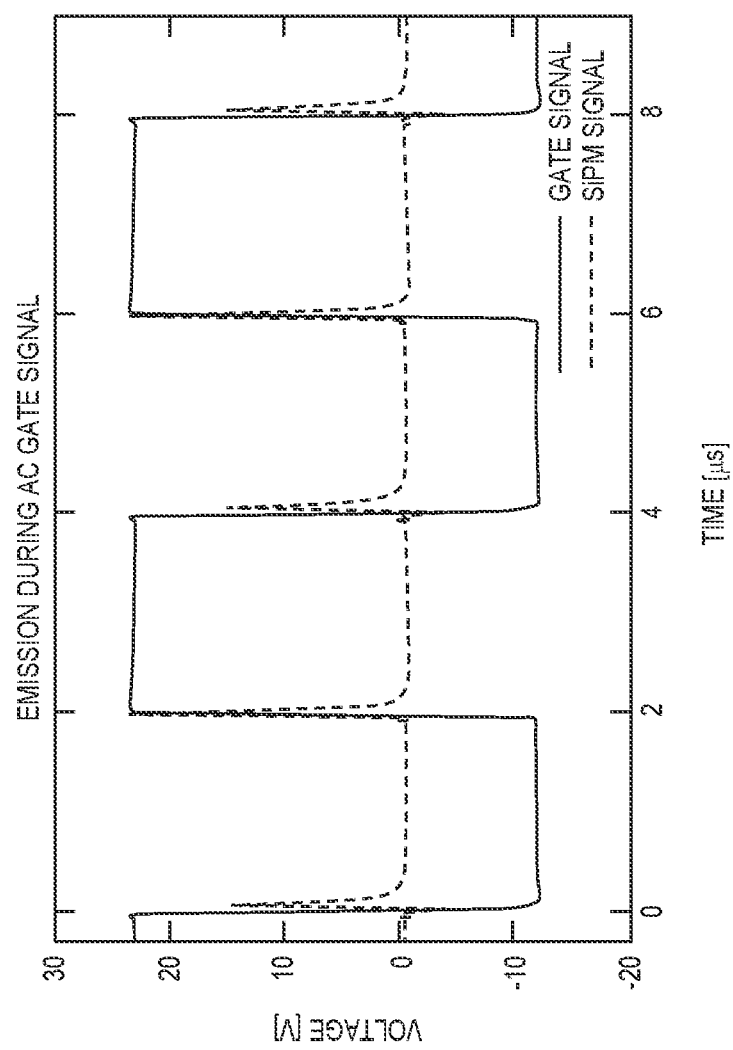
FIG. 12 illustrate waveform diagrams of the time dependence between the emitted light signal of the packaged semiconductor device and the gate signal applied to the device during testing.

FIG. 12 shows the time dependence of the emitted light signal 'SiPM' as a function of the gate signal applied to the packaged semiconductor device 1000. In the case of a SiC MOSFET, the packaged semiconductor device 1000 may be turned off with a negative gate voltage as shown in FIG. 12.

Hence, normal switching control of a SiC MOSFET brings about the light emission condition.

By driving the electrical device between accumulation and inversion, the intensity of the emitted light is proportional to the density of charge trapping states at the interface of 1200 where the energy of each emitted photon Ephoton is given by:

$$Ephoton = \frac{hc}{\lambda}$$

where h is Planck's constant, c is the speed of light in vacuum and λ is the wavelength of the emitted photon.

The spectrum of emitted light contains information about charge trapping defects at the interface of 1200 of interest. By measuring and characterizing the intensity and energy spectrum of the emitted light, information can be learned about the interface 1200 (e.g., a SiC-oxide interface). For example, the intensity of the emitted light is proportional to the defect density. Over time, the number of interface charge trapping states is expected to increase for a DC stress signal or decrease for an AC stress signal, which in either case can be observed as a change of the light intensity. If the device degrades during operation and the threshold voltage $V_{TH}$ increases, so too does the intensity of the emitted light. The sensor 106 previously described here can be used to monitor such a change in light intensity over the device lifetime. If the detected light intensity increases, e.g., by 20% a warning may be issued and the device replaced before the system breaks down.

The spectrum of the emitted light also provides useful information, which can be observed and characterized using the test apparatus. For example, the spectrometer device 1020 of the test apparatus may measure an energy spectrum of the emitted light, as explained above.

Figure 13:
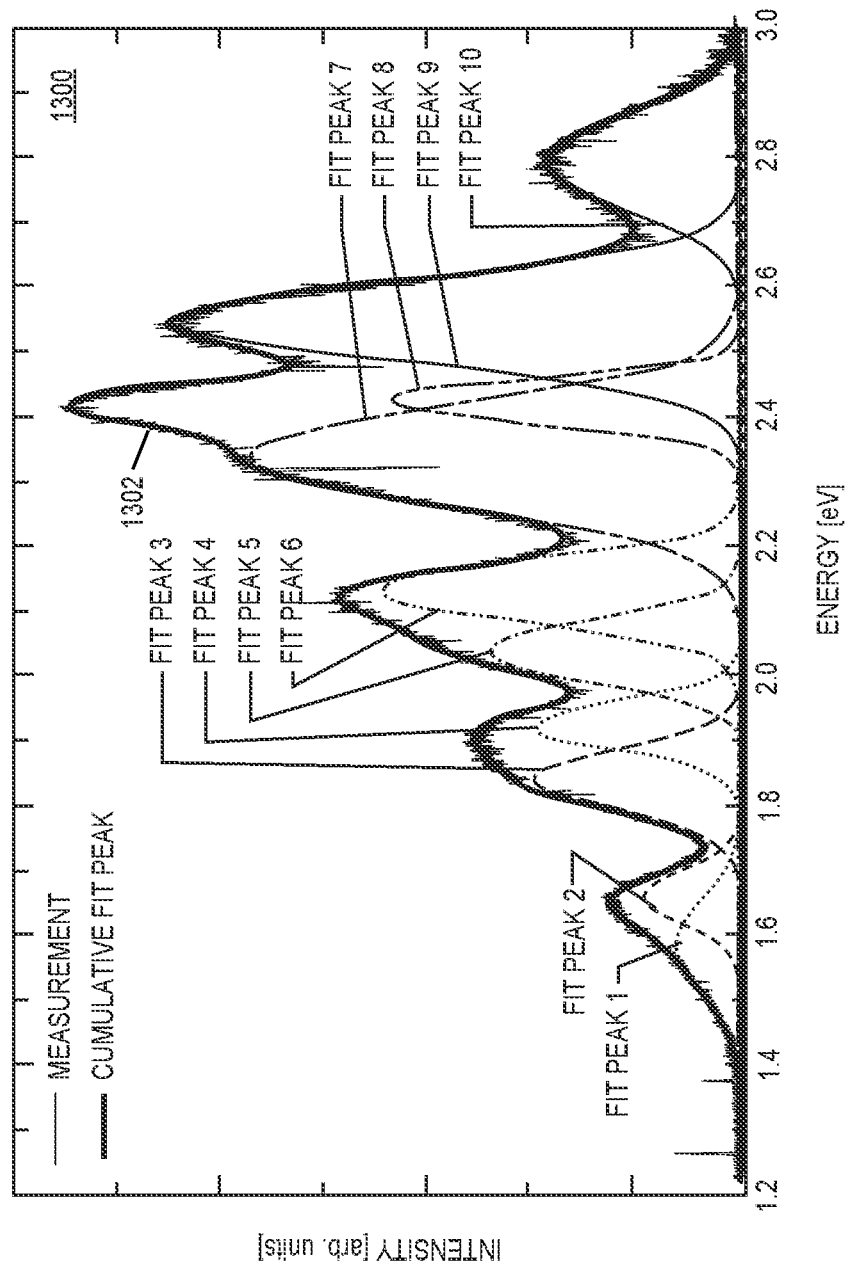
FIG. 13 illustrates waveform diagrams of an embodiment of an exemplary energy spectrum which has a cumulative peak curve that can be measured using the test apparatus shown in FIGS. 10 and 11.

FIG. 13 illustrates an embodiment of an exemplary energy spectrum 1300 which can be fitted by a cumulative peak curve 1302, which has several peaks (Peak 1 through Peak 10). By characterizing the spectrum of the measured light, different properties of the interface 1200 of interest may be investigated. For example, the spectrum information may be used to identify the microphysical nature of the trap states and use this information to tune the interface passivation of the device. Individual frequency signatures may be obtained from the measured signal. The test apparatus may include one or more filters (not shown) which allow only certain frequencies to pass where each peak shown in FIG. 13 may indicate an optical transition. The spectrometer device 1020 of the test apparatus may be used to determine which spectral transition(s) correlate most with device degradation. For example, the spectrometer device 1020 may be optimized for a certain wavelength region where the corresponding peak provides an even stronger correlation compared to a broadband photodiode. Such information may be used to tune the bandwidth of the sensor 106 described herein. For process development (zero-hour performance), the spectrometer device 1020 may be used to determine whether any peaks correspond to degraded channel mobility (e.g., a trap state). For example, process splits may be fabricated and the spectrometer device 1020 used to determine how the peaks move/intensity changes. The spectrometer device 1020 may be used to measure the spectrum and predict whether channel interface properties are improved or not. Further spectrum analysis implementation options are possible.

FIG. 14 illustrates another embodiment of a test apparatus for monitoring and characterizing a semiconductor device that includes an electrical device formed in an active region of a semiconductor body with the active region having an interface between the semiconductor body and an insulating material. The test apparatus embodiment illustrated in FIGS. 10 and 11 is designed for packaged semiconductor device whereas the test apparatus embodiment illustrated in FIG. 14 is designed for testing entire semiconductor wafers.

The test apparatus illustrated in FIG. 14 includes a first unit 1400 that is moveable in the x, y, and z directions. The first unit 1400 includes an objective 1402, a camera 1404, a flip mirror 1406, a reflective collimator 1408 and a spectrometer device 1410 which may be the same type of spectrometer device described above with reference to FIGS. 10 through 13. Hence, the spectrometer device 1410 may perform the same type of spectroscopy functions described above. The camera 1404 is used to locate the area to be measured which may be marked by a specific pattern integrated into the wafer backside metallization. The flip mirror 1406 is flipped after the area to be measured has been found, to couple light from the objective 1402 to the spectrometer device 1410.

The semiconductor wafer 1412 to be characterized may be received by a chuck 1414. The chuck 1414 has an opening 1416 over which the area of the wafer 1414 to be measured is placed during the characterization process. An ITO (indium tin oxide) coated glass substrate 1418 may be placed over the opening 1416 in the chuck 1414 and removable contact clamps 1420 may be used to clamp the semiconductor wafer 1412 to the ITO coated glass substrate 1418. The chuck 1414 together with the first unit 1400 form a second unit 1422 that is moveable in the x and y directions. The second unit 1422 may be moved to allow for proper contacting of the wafer frontside metallization for operating each device under test to generate the light emission to be characterized. The spectrum characterization performed by the test apparatus shown in FIG. 14 may be the same as explained above for the test apparatus shown in FIGS. 10 and 11.

The wafer backside metallization is either partly or completely removed before characterization measurements, otherwise the light emission of interest is absorbed. If only partly removed, e.g., only within small circles 1424, the remaining metallization may be contacted via the chuck 1414 which has an opening 1416 in the middle for the placement of the ITO coated glass substrate 1418. As ITO is transparent above 400 nm and electroconductive, the emission can pass the glass substrate 1418 while the ITO provides electrical contact to the backside metallization via removable contact clamps 1420. Holes in the substrate that are aligned to holes in the chuck allow the application of vacuum to fix the wafer 1412 on the ITO coated glass substrate 1418.

The emission is collected from the backside of the wafer 1412 via the objective 1402. The flip-mirror 1406 allows to choose between the camera 1404, which can be used for alignment, and spectral detection. The electrical contacts on the topside of the wafer 1412 are realized by probe needles (not shown). Alternatively, the same principle could be applied without the ITO coated glass substrate 1418 so that there is just a hole 1416 in the middle of the chuck 1414. This way, the wafer 1412 may be heated and the emission measured at higher temperatures.

Although the present disclosure is not so limited, the following numbered examples demonstrate one or more aspects of the disclosure.

Example 1. A semiconductor device, comprising: a semiconductor body; an electrical device formed in an active region of the semiconductor body, the active region including an interface between the semiconductor body and an insulating material; and a sensor having a bandwidth tuned to at least part of an energy spectrum of light emitted by carrier recombination at the interface when the electrical device is driven between accumulation and inversion, wherein an intensity of the emitted light is proportional to a density of charge trapping states at the interface, wherein the sensor is configured to output a signal that is proportional to the intensity of the sensed light.

Example 2. The semiconductor device of example 1, wherein the semiconductor body is a SiC semiconductor body, wherein the electrical device is a transistor, wherein the insulating material is a gate dielectric, wherein the interface is a channel interface, and wherein a change in magnitude of the signal output by the sensor is proportional to a threshold voltage drift.

Example 3. The semiconductor device of example 1 or 2, further comprising: an amplification circuit configured to amplify the signal output by the sensor.

Example 4. The semiconductor device of example 3, further comprising: a condition monitoring circuit configured to compare an output of the amplification circuit to a threshold.

Example 5. The semiconductor device of example 4, wherein the condition monitoring circuit is further configured to disable the electrical device or adjust a gate voltage for the electrical device to maintain a gate overdrive at a constant value, if the output of the amplification circuit crosses the threshold.

Example 6. The semiconductor device of any of examples 3 through 5, wherein the sensor is monolithically integrated in the same semiconductor body as the electrical device in a first semiconductor die, wherein the amplification circuit is disposed in a second semiconductor die, wherein the first semiconductor die further comprises a pin electrically coupled to the sensor, wherein the pin of the first semiconductor die is electrically coupled to a corresponding pin of the second semiconductor die, and wherein the pin of the second semiconductor die is electrically coupled to an input of the amplification circuit.

Example 7. The semiconductor device of any of examples 1 through 6, wherein the sensor is a photodiode, an avalanche photodiode or a silicon photo multiplier.

Example 8. The semiconductor device of any of examples 1 through 7, wherein the sensor is monolithically integrated in the same semiconductor body as the electrical device.

Example 9. The semiconductor device of example 8, wherein a direct optical path in the semiconductor body optically couples the sensor to the interface for at least part of the energy spectrum of the light emitted by carrier recombination at the interface when the electrical device is driven between accumulation and inversion.

Example 10. The semiconductor device of example 8 or 9, wherein the sensor is formed in the active region of the semiconductor body.

Example 11. The semiconductor device of example 8 or 9, wherein the sensor is formed in an edge termination region of the semiconductor body that laterally surrounds the active region and that is devoid of any fully functional cells of the electrical device.

Example 12. The semiconductor device of any of examples 8 through 11, wherein the sensor is disposed under a gate pad for the electrical device or adjacent a gate runner extending from the gate pad.

Example 13. The semiconductor device of any of examples 8 through 12, wherein the sensor is disposed in a trench formed in the semiconductor body.

Example 14. The semiconductor device of example 13, wherein the sensor comprises a semiconductor material of a first conductivity type disposed in a lower part of the trench and a semiconductor material of a second conductivity type opposite the first conductivity type disposed on the semiconductor material of the first conductivity type in an upper part of the trench.

Example 15. The semiconductor device of example 13, wherein the sensor comprises a first layer of semiconductor material of a first conductivity type lining sidewalls and a bottom of the trench and a second layer of semiconductor material of a second conductivity type opposite the first conductivity type formed over the first layer.

Example 16. The semiconductor device of any of examples 1 through 15, wherein the semiconductor body and the electrical device formed in the active region of the semiconductor body are included in a first semiconductor die, and wherein the sensor is included in a second semiconductor die.

Example 17. The semiconductor device of example 16, wherein the first semiconductor die and the second semiconductor die are arranged side-by-side, and wherein the light emitted by carrier recombination at the interface when the electrical device is driven between accumulation and inversion propagates through an edge of the first semiconductor die that faces the second semiconductor die and into an edge of the second semiconductor die that faces the first semiconductor die.

Example 18. The semiconductor device of example 16, wherein the first semiconductor die and the second semiconductor die are arranged one on the other in a stacked arrangement, and wherein the light emitted by carrier recombination at the interface when the electrical device is driven between accumulation and inversion propagates through a main surface of the first semiconductor die that faces the second semiconductor die and into a main surface of the second semiconductor die that faces the first semiconductor die.

Example 19. The semiconductor device of example 18, wherein the electrical device formed in the active region of the semiconductor body is a vertical power transistor, wherein a gate electrode and a source electrode for the vertical power transistor are disposed at a first main surface of the first semiconductor die, wherein a drain electrode for the vertical power transistor is disposed at a second main surface of the first semiconductor die opposite the first main surface, wherein the second main surface of the first semiconductor die faces the second semiconductor die, and wherein the drain electrode has an opening to permit light emitted by carrier recombination at the interface when the vertical power transistor is driven between accumulation and inversion to propagate into the main surface of the second semiconductor die that faces the first semiconductor die.

Example 20. The semiconductor device of any of examples 16 through 19, further comprising: an amplification circuit included in the second semiconductor die and configured to amplify the signal output by the sensor.

Example 21. The semiconductor device of example 20, further comprising: a condition monitoring circuit included in the second semiconductor die and configured to compare an output of the amplification circuit to a threshold.

Example 22. The semiconductor device of example 21, wherein the condition monitoring circuit is further configured to disable the electrical device or adjust a gate voltage for the electrical device to maintain a gate overdrive at a constant value, if the output of the amplification circuit crosses the threshold.

Example 23. The semiconductor device of any of examples 20 through 22, wherein the second semiconductor die further comprises a pin electrically coupled to an output of the amplification circuit.

Example 24. The semiconductor device of any of examples 1 through 23, wherein the bandwidth of the sensor is in a range of 1.3 to 3 eV.

Example 25. The semiconductor device of any of examples 1 through 24, wherein the bandwidth of the sensor is tailored to a subrange of the energy spectrum of the light emitted by carrier recombination at the interface when the electrical device is driven between accumulation and inversion, the subrange of the energy spectrum being most closely correlated to the density of charge trapping states at the interface.

Example 26. A method of monitoring a semiconductor device that includes an electrical device formed in an active region of a semiconductor body, the active region including an interface between the semiconductor body and an insulating material, the method comprising: driving the electrical device between accumulation and inversion; sensing at least part of an energy spectrum of light emitted by carrier recombination at the interface when the electrical device is driven between accumulation and inversion, wherein an intensity of the emitted light is proportional to a density of charge trapping states at the interface; and generating a signal that is proportional to the intensity of the sensed light.

Example 27. The method of example 26, further comprising: amplifying the signal that is proportional to the intensity of the sensed light.

Example 28. The method of example 27, further comprising: comparing the amplified signal to a threshold.

Example 29. The method of example 28, further comprising: disabling the electrical device if the amplified signal crosses the threshold.

Example 30. The method of any of examples 26 through 29, wherein the monitoring is performed during normal operation of the electrical device.

Example 31. The method of any of examples 26 through 30, wherein the monitoring is performed during testing of the electrical device.

Example 32. A test apparatus, comprising: a mechanical interface configured to receive an individual semiconductor device or a semiconductor wafer that includes a plurality of semiconductor devices, each semiconductor device including an electrical device formed in an active region of a semiconductor body, the active region including an interface between the semiconductor body and an insulating material; an electrical interface configured to drive each electrical device between accumulation and inversion; a spectrometer device configured to measure an energy spectrum of light emitted by carrier recombination at the interface of each electrical device when the electrical device is driven between accumulation and inversion, wherein an intensity of the emitted light is proportional to a density of charge trapping states at the interface; and one or more optical components configured to guide the emitted light to the spectrometer device.

Example 33. A method of characterizing a semiconductor device that includes an electrical device formed in an active region of a semiconductor body, the active region including an interface between the semiconductor body and an insulating material, the method comprising: driving each electrical device between accumulation and inversion; guiding, to a spectrometer device, light emitted by carrier recombination at the interface of the electrical device when the electrical device is driven between accumulation and inversion; and measuring, by the spectrometer device, an energy spectrum of the light emitted by carrier recombination at the interface of the electrical device when the electrical device is driven between accumulation and inversion, wherein an intensity of the emitted light is proportional to a density of charge trapping states at the interface.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
   a semiconductor body;
   an electrical device formed in an active region of the semiconductor body, the active region including an interface between the semiconductor body and an insulating material; and
   a sensor having a bandwidth tuned to at least part of an energy spectrum of light emitted by carrier recombination at the interface when the electrical device is driven between accumulation and inversion, wherein an intensity of the emitted light is proportional to a density of charge trapping states at the interface, wherein the sensor is configured to output a signal that is proportional to the intensity of the emitted light,
   wherein the sensor is monolithically integrated in the same semiconductor body as the electrical device, and
   wherein the sensor is formed in the active region of the semiconductor body.

2. The semiconductor device of claim 1, wherein the semiconductor body is a SiC semiconductor body, wherein the electrical device is a transistor, wherein the insulating material is a gate dielectric, wherein the interface is a channel interface, and wherein a change in magnitude of the signal output by the sensor is proportional to a threshold voltage drift.

3. The semiconductor device of claim 1, further comprising:
   an amplification circuit configured to amplify the signal output by the sensor.

4. The semiconductor device of claim 3, further comprising:
   a condition monitoring circuit configured to compare an output of the amplification circuit to a threshold.

5. The semiconductor device of claim 4, wherein the condition monitoring circuit is further configured to disable the electrical device or adjust a gate voltage for the electrical device to maintain a gate overdrive at a constant value, if the output of the amplification circuit crosses the threshold.

6. The semiconductor device of claim 3, wherein the sensor is monolithically integrated in the same semiconductor body as the electrical device in a first semiconductor die, wherein the amplification circuit is disposed in a second semiconductor die, wherein the first semiconductor die further comprises a pin electrically coupled to the sensor, wherein the pin of the first semiconductor die is electrically coupled to a corresponding pin of the second semiconductor die, and wherein the pin of the second semiconductor die is electrically coupled to an input of the amplification circuit.

7. The semiconductor device of claim 1, wherein a direct optical path in the semiconductor body optically couples the sensor to the interface for at least part of the energy spectrum of the light emitted by carrier recombination at the interface when the electrical device is driven between accumulation and inversion.

8. The semiconductor device of claim 1, wherein the sensor is disposed under a gate pad for the electrical device or adjacent a gate runner extending from the gate pad.

9. The semiconductor device of claim 1, wherein the sensor is disposed in a trench formed in the semiconductor body.

10. The semiconductor device of claim 9, wherein the sensor comprises a semiconductor material of a first conductivity type disposed in a lower part of the trench and a semiconductor material of a second conductivity type opposite the first conductivity type disposed on the semiconductor material of the first conductivity type in an upper part of the trench.

11. The semiconductor device of claim 9, wherein the sensor comprises a first layer of semiconductor material of a first conductivity type lining sidewalls and a bottom of the trench and a second layer of semiconductor material of a second conductivity type opposite the first conductivity type formed over the first layer.

12. The semiconductor device of claim 1, wherein the bandwidth of the sensor is tailored to a subrange of the energy spectrum of the light emitted by carrier recombination at the interface when the electrical device is driven between accumulation and inversion, the subrange of the energy spectrum being most closely correlated to the density of charge trapping states at the interface.

13. A semiconductor device, comprising:
a semiconductor body;
an electrical device formed in an active region of the semiconductor body, the active region including an interface between the semiconductor body and an insulating material;
a sensor having a bandwidth tuned to at least part of an energy spectrum of light emitted by carrier recombination at the interface when the electrical device is driven between accumulation and inversion, wherein an intensity of the emitted light is proportional to a density of charge trapping states at the interface, wherein the sensor is configured to output a signal that is proportional to the intensity of the emitted light; and
an amplification circuit configured to amplify the signal output by the sensor,
wherein the sensor is monolithically integrated in the same semiconductor body as the electrical device in a first semiconductor die,
wherein the amplification circuit is disposed in a second semiconductor die,
wherein the first semiconductor die further comprises a pin electrically coupled to the sensor,
wherein the pin of the first semiconductor die is electrically coupled to a corresponding pin of the second semiconductor die, and
wherein the pin of the second semiconductor die is electrically coupled to an input of the amplification circuit.

14. A semiconductor device, comprising:
a semiconductor body;
an electrical device formed in an active region of the semiconductor body, the active region including an interface between the semiconductor body and an insulating material; and
a sensor having a bandwidth tuned to at least part of an energy spectrum of light emitted by carrier recombination at the interface when the electrical device is driven between accumulation and inversion, wherein an intensity of the emitted light is proportional to a density of charge trapping states at the interface, wherein the sensor is configured to output a signal that is proportional to the intensity of the emitted light,
wherein the sensor is monolithically integrated in the same semiconductor body as the electrical device, and
wherein the sensor is formed in an edge termination region of the semiconductor body that laterally surrounds the active region and that is devoid of any fully functional cells of the electrical device.

15. A semiconductor device, comprising:
a semiconductor body;
an electrical device formed in an active region of the semiconductor body, the active region including an interface between the semiconductor body and an insulating material; and
a sensor having a bandwidth tuned to at least part of an energy spectrum of light emitted by carrier recombination at the interface when the electrical device is driven between accumulation and inversion, wherein an intensity of the emitted light is proportional to a density of charge trapping states at the interface, wherein the sensor is configured to output a signal that is proportional to the intensity of the emitted light,
wherein the sensor is monolithically integrated in the same semiconductor body as the electrical device, and
wherein the sensor is disposed under a gate pad for the electrical device or adjacent a gate runner extending from the gate pad.

16. A semiconductor device, comprising:
a semiconductor body;
an electrical device formed in an active region of the semiconductor body, the active region including an interface between the semiconductor body and an insulating material; and
a sensor having a bandwidth tuned to at least part of an energy spectrum of light emitted by carrier recombination at the interface when the electrical device is driven between accumulation and inversion, wherein an intensity of the emitted light is proportional to a density of charge trapping states at the interface, wherein the sensor is configured to output a signal that is proportional to the intensity of the emitted light,
wherein the sensor is monolithically integrated in the same semiconductor body as the electrical device, and
wherein the sensor is disposed in a trench formed in the semiconductor body.

17. The semiconductor device of claim 16, wherein the sensor comprises a semiconductor material of a first conductivity type disposed in a lower part of the trench and a semiconductor material of a second conductivity type opposite the first conductivity type disposed on the semiconductor material of the first conductivity type in an upper part of the trench.

18. The semiconductor device of claim 16, wherein the sensor comprises a first layer of semiconductor material of a first conductivity type lining sidewalls and a bottom of the trench and a second layer of semiconductor material of a second conductivity type opposite the first conductivity type formed over the first layer.

19. A semiconductor device, comprising:
a semiconductor body;
an electrical device formed in an active region of the semiconductor body, the active region including an interface between the semiconductor body and an insulating material; and
a sensor having a bandwidth tuned to at least part of an energy spectrum of light emitted by carrier recombination at the interface when the electrical device is driven between accumulation and inversion, wherein an intensity of the emitted light is proportional to a density of charge trapping states at the interface, wherein the sensor is configured to output a signal that is proportional to the intensity of the emitted light,
wherein the semiconductor body and the electrical device formed in the active region of the semiconductor body are included in a first semiconductor die,
wherein the sensor is included in a second semiconductor die,
wherein the first semiconductor die and the second semiconductor die are arranged side-by-side, and
wherein the light emitted by carrier recombination at the interface when the electrical device is driven between accumulation and inversion propagates through an edge of the first semiconductor die that faces the second semiconductor die and into an edge of the second semiconductor die that faces the first semiconductor die.

20. A semiconductor device, comprising:
a semiconductor body;
an electrical device formed in an active region of the semiconductor body, the active region including an interface between the semiconductor body and an insulating material; and
a sensor having a bandwidth tuned to at least part of an energy spectrum of light emitted by carrier recombination at the interface when the electrical device is driven between accumulation and inversion, wherein an intensity of the emitted light is proportional to a density of charge trapping states at the interface, wherein the sensor is configured to output a signal that is proportional to the intensity of the emitted light,
wherein the semiconductor body and the electrical device formed in the active region of the semiconductor body are included in a first semiconductor die,
wherein the sensor is included in a second semiconductor die,
wherein the first semiconductor die and the second semiconductor die are arranged one on the other in a stacked arrangement, and
wherein the light emitted by carrier recombination at the interface when the electrical device is driven between accumulation and inversion propagates through a main surface of the first semiconductor die that faces the second semiconductor die and into a main surface of the second semiconductor die that faces the first semiconductor die.

21. The semiconductor device of claim 20, wherein the electrical device formed in the active region of the semiconductor body is a vertical power transistor, wherein a gate electrode and a source electrode for the vertical power transistor are disposed at a first main surface of the first semiconductor die, wherein a drain electrode for the vertical power transistor is disposed at a second main surface of the first semiconductor die opposite the first main surface, wherein the second main surface of the first semiconductor die faces the second semiconductor die, and wherein the drain electrode has an opening to permit light emitted by carrier recombination at the interface when the vertical power transistor is driven between accumulation and inversion to propagate into the main surface of the second semiconductor die that faces the first semiconductor die.

* * * * *